United States Patent
Liu et al.

(10) Patent No.: US 12,002,602 B2
(45) Date of Patent: Jun. 4, 2024

(54) OPTICALLY CONSISTENT TRANSPARENT CONDUCTIVE FILM AND PREPARATION METHOD THEREOF

(71) Applicant: JIANGSU NANOMEIDA OPTOELECTRONICS TECHNOLOGY CO., LTD, Jiangsu (CN)

(72) Inventors: Tengjiao Liu, Beijing (CN); Yanping Su, Beijing (CN); Xin Li, Beijing (CN); Yuan Hu, Beijing (CN)

(73) Assignee: JIANGSU NANOMEIDA OPTOELECTRONICS TECHNOLOGY CO., LTD., Suzhou (CN)

( * ) Notice: Subject to any disclaimer, the term of this patent is extended or adjusted under 35 U.S.C. 154(b) by 234 days.

(21) Appl. No.: 17/631,854

(22) PCT Filed: Aug. 31, 2020

(86) PCT No.: PCT/CN2020/112487
§ 371 (c)(1),
(2) Date: Jan. 31, 2022

(87) PCT Pub. No.: WO2021/018315
PCT Pub. Date: Feb. 4, 2021

(65) Prior Publication Data
US 2022/0285044 A1    Sep. 8, 2022

(30) Foreign Application Priority Data

Jul. 29, 2019 (CN) .......................... 201910689170.8

(51) Int. Cl.
*H01B 5/14* (2006.01)
*B05D 1/26* (2006.01)
(Continued)

(52) U.S. Cl.
CPC ................. *H01B 5/14* (2013.01); *B05D 1/26* (2013.01); *B05D 3/0254* (2013.01); *B05D 3/06* (2013.01);
(Continued)

(58) Field of Classification Search
CPC ............................................. G06F 2203/04112
See application file for complete search history.

(56) References Cited

FOREIGN PATENT DOCUMENTS

| CN | 1298906 A | 6/2001 |
|---|---|---|
| CN | 1414401 A | 4/2003 |

(Continued)

OTHER PUBLICATIONS

Vasilopoulou et al.; "Highly transparent partially fluorinated methacrylate polymers for optical waveguides;" Microelectronic Engineering; Jan. 2009; pp. 1142-1145; vol. 86.

(Continued)

*Primary Examiner* — Ian A Rummel
(74) *Attorney, Agent, or Firm* — Oliff PLC (57) ABSTRACT

An optically consistent transparent conductive film and a preparation method thereof solve the problems of obvious etching marks, poor optical stability, easy corrosion of nanomaterials, and migration of metal ions of the metal nanowire transparent conductive film. The addition of nanoparticles with a matchable refractive index and a high corrosion resistance, the addition of an optical compensation layer, the use of a substrate with an anti-glare layer and other such means can solve the problem of obvious post-treatment etching marks of metal nanowire conductive films. A dense full-plate conductive transparent conductive film with improved corrosion resistance can be achieved by using an electric compensation layer. An ultraviolet stabilizer is added into a protective solution to improve the optical stability of the conductive film. An antioxidant, a dendrimer, (Continued)

and a complexing agent in the protective solution solve the problem of easy corrosion of nanomaterials and migration of metal ions.

12 Claims, 6 Drawing Sheets

(51) Int. Cl.
*B05D 3/02* (2006.01)
*B05D 3/06* (2006.01)
*B05D 3/14* (2006.01)
*B05D 7/00* (2006.01)
*G02B 1/11* (2015.01)
*G02B 1/14* (2015.01)

(52) U.S. Cl.
CPC ............ *B05D 3/067* (2013.01); *B05D 3/142* (2013.01); *B05D 7/54* (2013.01); *G02B 1/11* (2013.01); *G02B 1/14* (2015.01)

(56) References Cited

FOREIGN PATENT DOCUMENTS

| CN | 101246224 A | 8/2008 |
|---|---|---|
| CN | 102655031 A | 9/2012 |
| CN | 103460304 A | 12/2013 |
| CN | 104145313 A | 11/2014 |
| CN | 104299681 A | 1/2015 |
| CN | 110415865 A | 11/2019 |
| JP | 2009-094033 A | 4/2009 |
| KR | 101631854 B1 | 6/2016 |

OTHER PUBLICATIONS

Teng et al.; "Alternating Copolymerization of Bis(hexafluoroisopropyl) Fumarate with Styrene and Vinyl Pentafluorobenzoate: Transparent and Low Refractive Index Polymers;" Journal of Polymer Science Part A: Polymer Chemistry; May 2011; pp. 2834-2838; vol. 49.

Castner et al.; "Fluorinated Surfaces, Coatings, and Films;" ACS Symposium Series; 2001 (year is sufficiently early that month is not at issue); pp. i-iii; vol. 787; American Chemical Society.

Nov. 26, 2020 Search Report issued in International Patent Application No. PCT/CN2020/112487.

OPTICALLY CONSISTENT TRANSPARENT CONDUCTIVE FILM AND PREPARATION METHOD THEREOF

CROSS REFERENCE TO RELATED APPLICATIONS

The present application claims the priority of the Chinese patent application with an application number of 201910689170.8 and filed on Jul. 29, 2019, and the entire contents of which are incorporated herein by reference.

TECHNICAL FIELD

The present invention relates to the technical field of transparent conductive films, in particular to an optically consistent transparent conductive film, which can be applied to electronics industry, e.g., rigid or flexible touch screens, rigid or flexible displays, cell phone antenna circuits, infrared optical imaging elements, photoelectric sensors, electromagnetic shielding, smart windows, smart handwriting boards or/and solar cells.

BACKGROUND ART

Transparent conductive films refer to films that are both conductive and have high transmittance in the range of visible light. Transparent conductive films have broad application prospects in rigid or flexible touch screens, rigid or flexible displays, cell phone antenna circuits, infrared optical imaging elements, photoelectric sensors, electromagnetic shielding, smart windows, smart handwriting boards, solar cells, etc.

An indium tin oxide (ITO) is the most commonly used material now, which is called to be "transparent" since it has a large band gap and only absorbs ultraviolet light and does not absorb visible light. The ITO film with favorable chemical stability and thermal stability is prepared through a magnetron sputtering process. However, the application of ITO film is restricted for its complicated preparation, high cost, high square resistance, not easy to bend and deform, and fragile and easy to break, etc.

In recent years, with the advent of a variety of touch products, flexibility has gradually become a development trend of the touch electronics industry. The transparent conductive film is the key material required for display and touch. ITO films and an ITO layer thereof used in traditional rigid touch products are fragile and easy to break and lack flexibility, no flexible panel can be made, thereby limiting the application of ITO in the flexible touch field. Therefore, it is urgent to find a transparent conductive film with high flexibility to meet the requirements of the flexible touch electronics industry.

Owing to such advantages as excellent photoelectric properties, high flexibility, high strength, low price and simple preparation process, metal nanowire transparent conductive film has become an optimal alternative material of ITO, wherein silver nanowire transparent conductive film is particularly prominent. However, when metal nanowire transparent conductive film is used in the touch field, some problems still exist, e.g., problems including obvious post-treatment etching marks, poor optical stability, easy corrosion of metal materials, short service life and migration of metal ions, and such problems are all problems needing to be solved urgently in the industry. Especially with the advent of foldable touch screens in 2019, the etching marks, service life and bendability of flexible transparent conductive film have become the primary constraints for large-scale promotion of foldable cell phones.

SUMMARY OF THE INVENTION

The present invention provides an optically consistent transparent conductive film, aiming at solving the problems of obvious post-treatment etching marks, poor optical stability, easy corrosion of metal materials and migration of metal ions of the metal nanowire conductive film, to satisfy a variety of application requirements. The present invention is simple in preparation, and the obtained film has excellent photoelectric properties and optical stability.

The present invention provides an optically consistent transparent conductive film, and at least contains the following parts or any combination thereof: a substrate, an optically consistent conductive layer and a protective layer;
wherein the substrate: the substrate includes a rigid or/and flexible substrate;
the optically consistent conductive layer: the optically consistent conductive layer at least includes a conductive area, the conductive area includes a conductive area constituted by metal nanowires A and nanoparticles B, the metal nanowires A superimpose or crosslink to form a network in a conductive area, meanwhile, the nanoparticles B are uniformly distributed in the conductive area, the influence of the nanoparticles B on the conductivity of the metal nanowires A is less than 50%; the optically consistent conductive layer includes a non-conductive area obtained by etching the metal nanowires A in the conductive area, the non-conductive area includes nanoparticles B, the nanoparticles B do not form a continuous conductive pathway with each other in the non-conductive area; and
the protective layer: the protective layer is coated on the surface of the conductive film of an optically consistent conductive layer, and the protective layer contains dendrimers with a chelating effect.

Preferably, the protective layer contains a dendrimer with a chelating effect. The dendrimer may trap metal ions to form a chelate to inhibit migration of metal ions; optionally, the protective layer contains uniformly dispersed nanoparticles B, and the refractive index of nanoparticles B is adapted to that of metal nanowires A.

Preferably, the rigid substrate includes one of glass, PMMA organic glass, PC polycarbonate or acrylic resin; and the flexible substrate includes one of polyester, polyethylene, cycloolefin polymer, colorless polyimide, polypropylene, or polyethylene.

Preferably, the optically consistent transparent conductive film may include a functional layer. The functional layer includes one or a combination of a transmission enhancement layer, an anti-reflective layer, an anti-glare layer, an optical adaptation layer, an electrical adaptation layer, and a hardened layer.

Preferably, the vaporization temperature of nanoparticles B is higher than metal nanowires A; the corrosion rate of metal nanowires A is faster than nanoparticles B; and the refractive index of nanoparticles B is adapted to metal nanowires A, such that the difference of the optical transmittance, reflectivity, haze, chromaticity and other parameters of the conductive area and the non-conductive area is less than 2%, thereby forming optical consistency. Preferably, the morphology of nanoparticles B includes a spherical shape, a core-shell, a rod, a heterojunction, or any combination thereof. The material of nanoparticles B includes metals, alloys, oxides, semiconductors, conductors, insulators or any combination thereof. The size of nanoparticles B is less than or equal to 200 nm, and further preferably, the size is less than or equal to 20 nm and is greater than or equal to 5 nm. The nanoparticles B have an effect of adjusting the chromaticity of the conductive film.

Preferably, the structure of the metal nanowire A includes one or more of core-shell nanowire, hollow nanowire and solid nanowire. The metal nanowire A has a diameter of 5-200 nm and an aspect ratio of greater than or equal to 100. The metal nanowire is preferably a silver nanowire.

Preferably, the composition of the protective layer includes a dendrimer with a chelating effect, and the dendrimer includes one or more of a polyamidoamine dendrimer, a carboxyl modified polyamidoamine dendrimer, and a hydroxyl modified polyamidoamine dendrimer.

Preferably, the composition of the transmission enhancement layer includes a fluoropolymer, and the transmission enhancement layer is arranged between the substrate and the conductive layer, or on the back side of the substrate, or above the protective layer;

the composition of the anti-reflective layer includes fluoropolymer or a perfluoropolymer, and the anti-reflective layer is arranged between the substrate and the conductive layer, or on the back side of the substrate, or above the protective layer;

the composition of the anti-glare layer includes one or more of fluorine-based compounds, siloxane-based compounds, nanomaterials doped with oxides or transparent organic polymers, and the anti-glare layer is arranged on the back side of the substrate;

the optical adaptation layer is a metal layer or a ceramic layer formed by sputtering, evaporation or coating, the composition of the optical adaptation layer includes metals, alloys, oxide nanomaterials and combinations thereof, and the optical adaptation layer is arranged between the conductive layer and the substrate;

the electrical adaptation layer is a dense planar conductive layer or an electrostatic layer, wherein the dense planar conductive layer or the electrostatic layer includes one or more of PEDOT:PSS, transparent conductive metal oxides, graphene, carbon nanotubes and carbon black, and the electrical adaptation layer is arranged above or below the protective layer.

The present invention provides a preparation method of an optically consistent transparent conductive film, including the following steps or a combination thereof:

S1, coating conductive ink on the substrate to form a conductive area, wherein the conductive ink includes nanoparticles B and metal nanowires A;

S2, etching the metal nanowires A at the conductive area prepared in S1 to form a non-conductive area, vaporizing or corroding metal nanowires A, while retaining nanoparticles B at the etched position; and S3, constituting an optically consistent conductive layer by a conductive area formed in S1 and a non-conductive area formed in S2, coating protective layer formulation solution containing dendrimer on the conductive layer, and performing thermal curing or ultraviolet curing to form a protective layer.

Preferably, the conductive ink formulation includes 0.01-0.5% of metal nanoparticles B, 0.01%-5% of film-forming agent, 0.002-1% of leveling agent, 0.05-5% of metal nanowires A, and 70-99% of conductive ink solvent.

Preferably, the composition of the protective layer formulation solution includes 0.001%-0.05% of dendrimer, 0.07%-8% of monomer, 0.05%-1.5% of initiator, and 0.1%-5% of prepolymer. The monomer includes one or more of HEA, TPGDA, HPA, DAA, TMPTA, TMPTMA, EO-TMPTA, epoxy propylene ester, EO-CHA, DPGDA, IBOA, PGDA, PDDA, TEGDA, HDDA and BDDA. The initiator includes one or more of α-hydroxy ketone-based initiator, acylphosphine oxide and ketone-based initiator. The prepolymer includes one or more of aliphatic urethane acrylate prepolymer, aromatic urethane acrylate prepolymer, urethane methacrylate, diallyl phthalate prepolymer, epoxy acrylate and epoxy methacrylate.

Preferably, the protective layer formulation solution further includes 0.03%-5% of cellulose acetate butyrate and 60%-99% of solvent of the protective layer formulation solution, the solvent in the protective layer formulation solution includes one or more of isopropanol, methanol, ethanol, n-propanol, diacetone alcohol, acetone, and butyl acetate.

Preferably, to prevent invalidation of the conductive area due to migration of metal ions, the composition of the protective layer formulation solution also includes one or more of 0.003%-0.3% of complexing agent, 0.005%-0.4% of stabilizer and 0.003%-0.5% of antioxidant, wherein the complexing agent complexes metal ions and prevents migration of metal ions. The complexing agent includes one or more of complexone, 8-hydroxyquinoline, dithizone, 2,2'-bipyridine (bipy), o-phenanthroline (C12H8N2), potassium sodium tartrate, ammonium citrate and inorganic complexing agent polyphosphate; the stabilizing agent may prevent plasma resonance of metal crystals, the stabilizing agent includes one or more of BASF ultraviolet absorber C81, Chimassorb 944, Tinuvin 770DF, Tinuvin 900, Tinuvin 123, Tinuvin 326, Tinuvin 234, Tinuvin 765, Tinuvin 791FB, Tinuvin 384-2, Tinuvin 144, UV70 and UV90; the antioxidant may prevent invalidation of a conductive film due to free radicals, and the antioxidant includes one or more of SONGNOX 4150, Irganox 1098, Irganox 1076, Irganox 1010 and Irganox 168.

Preferably, step S1 further includes first optimization treatment. The first optimization treatment is applicable to any stage of the step, and the first optimization treatment includes: corona treatment or plasma treatment.

Preferably, step S2 further includes second optimization treatment. The second optimization treatment is applicable to any stage of the step; step S3 includes second optimization treatment, the second optimization treatment is applicable to all the stages of the step; the second optimization treatment includes: infrared radiation treatment, microwave radiation treatment, xenon lamp pulse treatment or photon sintering treatment.

Preferably, the method further includes preparation of a functional layer, wherein the functional layer is arranged between a substrate and a conductive layer, or on the back side of the substrate, or above the protective layer.

The application of the optically consistent transparent conductive film is provided, wherein the applications refer to applications in rigid or flexible touch screens, rigid or flexible displays, cell phone antenna circuits, infrared optical imaging elements, photoelectric sensors, electromagnetic shielding, smart windows, smart handwriting boards or/and solar cells.

Figure 16:
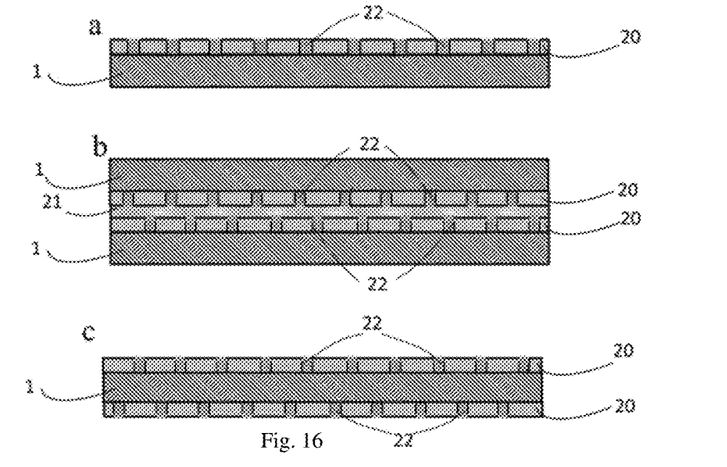
FIGS. 16a, 16b and 16c are structural schematic diagrams showing that nanoparticles B are uniformly distributed in a non-conductive area after a conductive layer is etched in the application of capacitive rigid or flexible touch screens.
Figure 17:
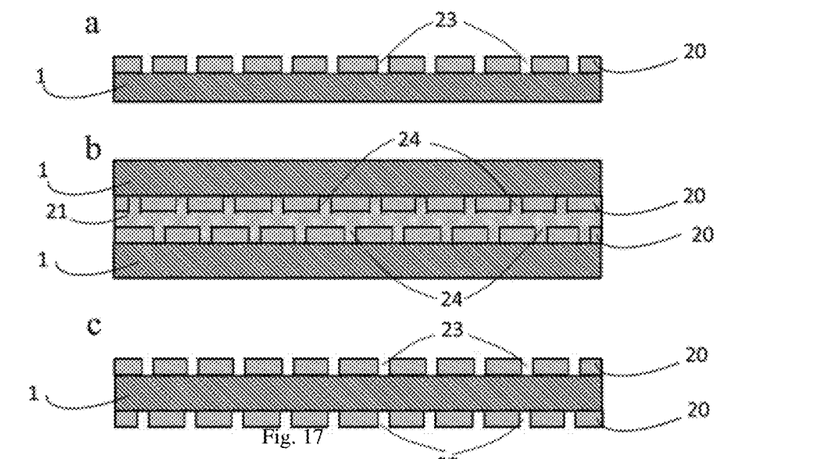
FIGS. 17a and 17c are schematic diagrams showing that a non-conductive area has no residues after a conductive layer is etched in the application of capacitive rigid or flexible touch screens.
FIG. 17b shows a structure in which X and Y sensing lines are respectively arranged in different conductive films in the applications of capacitive rigid or flexible touch screens.
Figure 18:
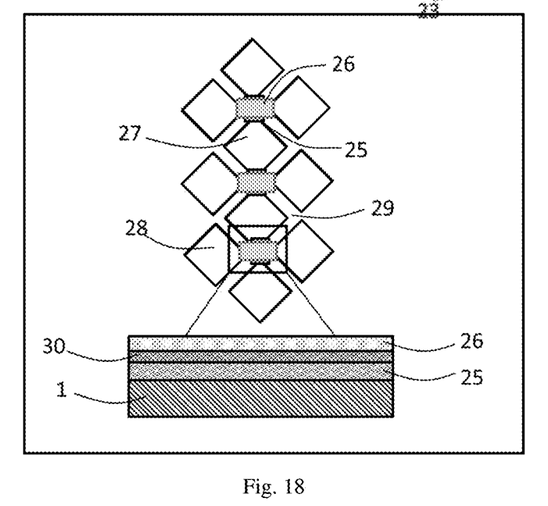
FIG. 18 shows an enlarged schematic diagram of a top view and a side view of a structure in which X and Y sensing lines are arranged on the same conductive surface.

For example, in the application of a capacitive rigid or flexible touch screen, the optically consistent transparent conductive film is constituted by a conductive area and a non-conductive area. The structure includes, but is not limited to, a structure in which X and Y sensing lines are arranged on the same conductive surface (e.g., FIG. 16a), a structure in which X and Y sensing lines are respectively arranged on separate conductive films (e.g., FIG. 16b), and a structure in which X and Y sensing lines are arranged on the upper and lower sides of the same conductive film (e.g., FIG. 16c). 20 refers to a conductive area after etching, 22 refers to a non-conductive area with nanoparticles B uniformly distributed after etching, and 21 refers to laminating adhesive. FIGS. 16a, 16b and 16c are structural schematic diagrams showing that nanoparticles B are uniformly distributed in a non-conductive area after a conductive layer is etched in the application of capacitive rigid or flexible touch screens. As a comparison, FIGS. 17a and 17c are schematic diagrams showing that a non-conductive area has no residues after a conductive layer is etched in the application of capacitive rigid or flexible touch screens. 23 refers to a non-conductive area, with obvious etching marks. In FIG. 17b, the non-conductive area is filled with laminating adhesive 21. 24 refers to a non-conductive area filled with laminating adhesive. With a diamond-shaped etching pattern as an example, FIG. 18 shows an enlarged schematic diagram of a top view and a side view of a structure in which the X and Y sensing lines are arranged on the same conductive surface (further description of the structure of FIG. 16a and FIG. 17a), wherein 1 refers to a substrate, 27 refers to a conductive area in the Y direction, the conductive areas in the Y direction are interconnected through the unetched area 25, 29 refers to a non-conductive area, 30 refers to an insulating layer, 26 refers to a conductive connection layer in the X direction, 28 refers to a conductive area in the X direction, to achieve jumper connection in the X direction. So that the Y direction and X direction each form a separate circuit to achieve capacitive touch positioning.

Preferably, the etching is laser etching, wet etching or yellow light etching. Through adjusting parameters such as laser etching power, etching speed, or parameters such as etching tank circulation flow, etching tank temperature, cleaning tank spray volume, wind knife frequency and flow rate at air drying of wet etching, or adjusting parameters such as exposure energy, exposure GAP value, exposure platform temperature of yellow light etching, the etched line width is determined. The silver nanowires A on the etched line are vaporized or eroded and the nanoparticles B not communicated with each other are retained, to form a non-conductive area, and the unetched area as a conductive area includes silver nanowires A and nanoparticles B. As further explained, the optically consistent transparent conductive film provided in the present invention includes at least the following components or any combination thereof:
a) a substrate: a rigid or/and flexible base material with optical transparency or/and haze;
b) an optically consistent conductive layer: the optically consistent conductive layer at least includes a conductive area constituted by metal nanowires A and nanoparticles B, the metal nanowires A form a superimposed or crosslinked network in the area, meanwhile, the nanoparticles B are uniformly distributed in the conductive area, the influence of the nanoparticles B on the electrical conductivity of the metal nanowires A is less than 50%; or the optically consistent conductive layer includes a non-conductive area obtained through etching at the conductive area, the non-conductive area is composed of nanoparticles B, the nanoparticles B are uniformly distributed in the non-conductive area, but the nanoparticles B do not form a continuous conductive pathway with each other in the non-conductive area; the vaporization temperature of the nanoparticles B is higher than that of the metal nanowires A; the corrosion rate of the metal nanowires A is greater than the corrosion rate of nanoparticles B; the refractive index of nanoparticles B may be adapted to or approximate to the refractive index of the metal nanowires A, such that the difference of the optical transmittance, reflectivity, haze, chromaticity and other parameters of the conductive area and the non-conductive area is less than 2%, thereby forming optical consistency;
c) a protective layer: the protective layer is arranged above the optically consistent conductive layer, the protective layer contains dendrimers with a chelating effect, and can trap metal ions to form a chelate to inhibit migration of metal ions; the protective layer contains nanoparticles B, wherein the refractive index of nanoparticles B may be adapted to or approximate to the refractive index of metal nanowires A, to reduce the chromaticity of the conductive area;
d) a functional layer: the functional layer is one or a combination of a transmission enhancement layer, an anti-reflective layer, an anti-glare layer, an optical adaptation layer, an electrical adaptation layer and a hardened layer.

A substrate: the substrate refers to a material on which metal nanowires are directly coated or a functional layer is coated and then subsequent operation is performed. The substrates described herein are either rigid or flexible. Rigid substrates include (but are not limited to): glass, PMMA organic glass, PC polycarbonate, acrylic resin, etc. The flexible substrates include (but are not limited to): polyesters (e.g., polyethylene terephthalate (PET), polynaphthalene dicarboxylate and polycarbonate), polyethylene (e.g., polyvinyl chloride, polyvinylidene chloride, polyvinyl acetal, polyacrylate, etc.), cycloolefin polymers (COP), colorless polyimide (CPI), polypropylene (PP), polyethylene (PE), etc.

Figure 12:
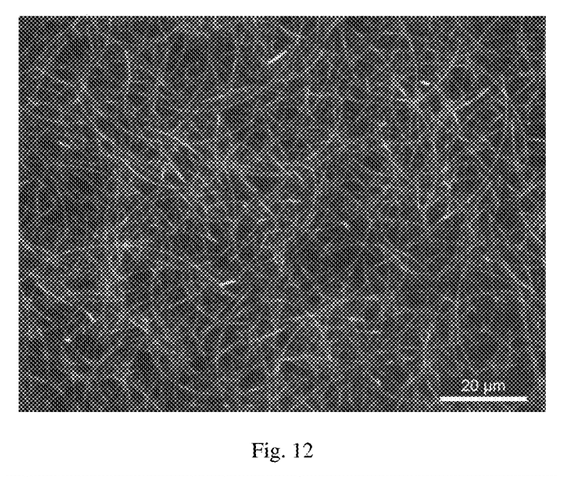
FIG. 12 is a microscopic view of the surface of a full-plate conductive transparent conductive film obtained by none nanoparticles B in the conductive ink of the present invention.
Figure 13:
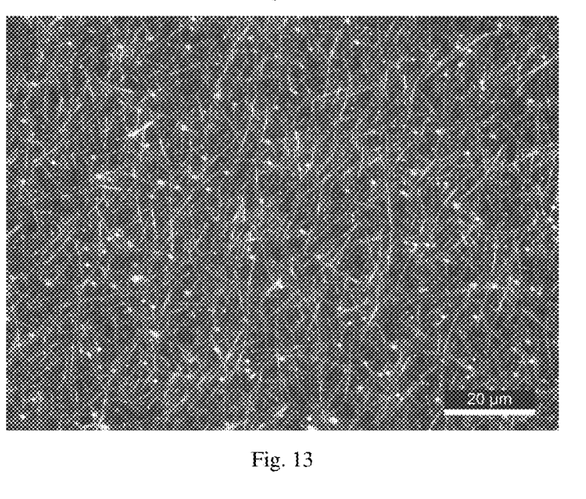
FIG. 13 is a microscopic view of the surface of a full-plate conductive transparent conductive film obtained by including nanoparticles B in the conductive ink of the present invention.

An optically consistent conductive layer: the optically consistent conductive layer contains at least a conductive area composed of metal nanowires A and nanoparticles B. Metal nanowires A form networks which are mutually superimposed or crosslinked in the area, while nanoparticles B are uniformly distributed in the conductive area, and the influence of nanoparticles B on the electrical conductivity of metal nanowires A is less than 50%. FIG. 13 shows an optically consistent conductive layer before etching, as a comparison, FIG. 12 shows a microscopic view of a conductive layer containing no nanoparticles B. The refractive index of nanoparticles B and the refractive index of metal nanowires A can be adapted, such that after etching, as to the conductive area composed of metal nanowires A and nanoparticles B and the non-conductive area composed of nanoparticles B which are not interconnected, the difference of such parameters as optical transmittance, reflectivity, haze and chromaticity is less than 2%, thereby forming an optical consistency.

Figure 7:
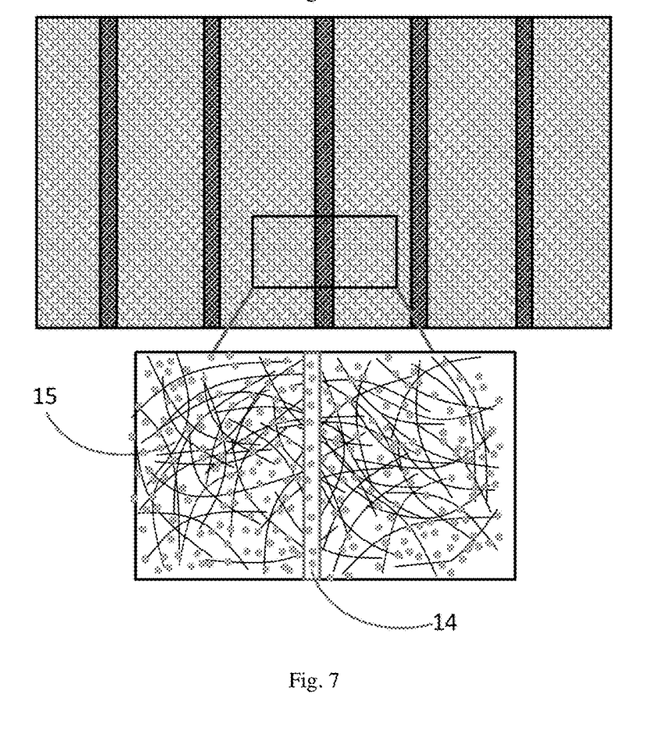
FIG. 7 is a schematic diagram showing that nanoparticles B are uniformly distributed in the non-conductive area and metal nanowires A and nanoparticles B are uniformly distributed in a conductive area after etching in the present invention.
Figure 14:
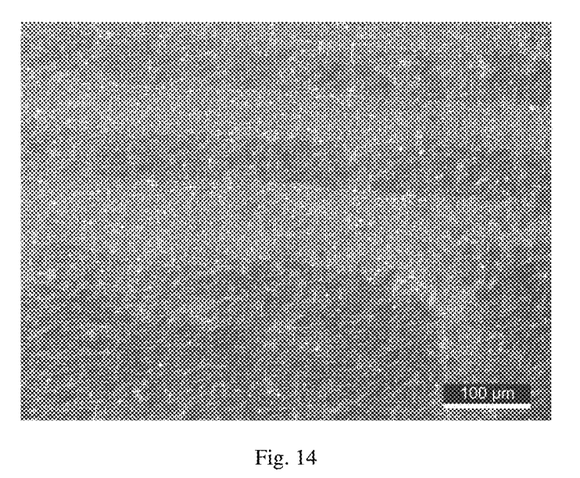
FIG. 14 is a microscopic view of the surface of a transparent conductive film with nanoparticles B uniformly distributed in the non-conductive area and metal nanowires A and nanoparticles B uniformly distributed in the conductive area after etching of the present invention.

The optically consistent conductive layer contains a non-conductive area obtained from etching. The vaporization temperature of nanoparticles B is higher than the metal nanowires A, and the corrosion rate of the metal nanowires A is greater than the corrosion rate of nanoparticles B. Through controlling proper etching conditions, the metal nanowires A are etched and the nanoparticles B are retained to form a non-conductive area. The nanoparticles B are uniformly distributed in the non-conductive area, but do not form a continuous conductive pathway with each other in the non-conductive area. For example, as to the conductive layer composed of silver nanowires and gold nanoparticles, the vaporization temperature of gold is 2807° C., and the vaporization temperature of silver is 2212° C. Due to a large difference between the vaporization temperatures of gold and silver, in the laser etching process, appropriate laser energy is adjusted to only vaporize a large amount of silver nanowires, while gold nanoparticles are retained. The resultant non-conductive area contains a large number of gold nanoparticles. The substrate is generally composed of polymer materials, while the conductive layer is made of metal materials. Metal materials and polymer materials are vastly different from each other in terms of refractive index and extinction coefficient and other optical parameters. Direct exposure of the substrate material after etching will produce a large difference in reflectivity, and etching marks may be observed through naked eyes. The introduction of nanoparticles B enables the non-conductive area formed by etching to retain nanoparticles B, thereby compensating for the refractive index difference with the conductive area, eliminating the differences between the conductive area and the non-conductive area in terms of optical transmittance, reflectivity, haze, and chromaticity, thereby forming optical consistency (as shown in FIGS. 7 and 14).

Figure 4:
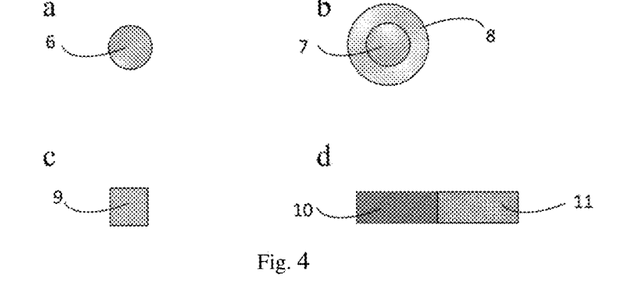
FIG. 4 is a structural schematic diagram of nanoparticles B added in the conductive ink and the protective layer formulation solution of the present invention.

The morphology of nanoparticles B is a spherical shape, a core-shell, a rod, a heterojunction, or any combination thereof, as shown in FIG. 4. The material of the nanoparticles B includes metals, alloys, semiconductors, conductors, metal oxides or any combination thereof, with sizes being less than or equal to 200 nm, and preferably, the size is less than or equal to 20 nm. The core-shell morphology often results in significant changes in the extinction coefficients of nanomaterials and has potential applications in the design of some important optical films. In addition, due to the size effect of nanoparticles, the color of nanoparticles of different sizes will be greatly changed. For example, the nanoparticles of platinum and palladium will be generally black at 10 nm; while the nanoparticles of gold will be purple black at about 10 nm. The addition of nanoparticles B can also be used to adjust the chromaticity of the optically consistent conductive layer.

As a conductive unit of an optically consistent conductive layer, the structure of metal nanowires A includes: a core-shell structure, a hollow structure, or a linear structure with a diameter less than or equal to 200 nm and an aspect ratio greater than or equal to 100. The conductivity of the conductive layer is determined by the following aspects: the conductivity of a single metal nanowire A, the density of metal nanowires A in the conductive layer and the connectivity of metal nanowires A with each other. When other conditions are certain, the conductivity of the conductive surface can be regulated by controlling the conductivity of each metal nanowire. When the conductivity of each single metal nanowire A is the same, and the density of the metal nanowire A in the conductive layer is low, and the metal nanowires A hardly overlap with each other to form conductive path, the conductive layer performs high sheet resistance or non-conductive. The conductivity of each single metal nanowire A and the distribution density of metal nanowires A are certain, and the interconnection between metal nanowires A is poor, the conductive layer performs very high resistance or even insulating.

Figure 8:
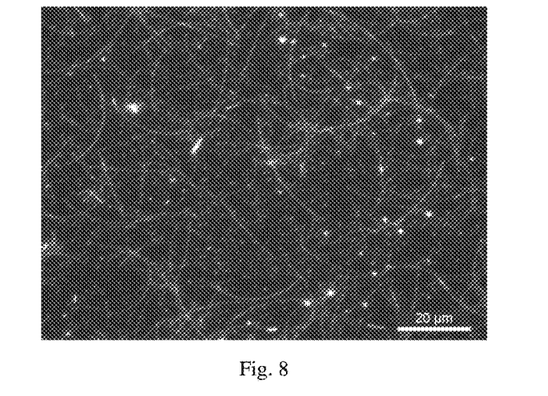
FIG. 8 is a microscopic view of the surface of the film with a very low distribution density of metal nanowires A of the present invention.
Figure 15:
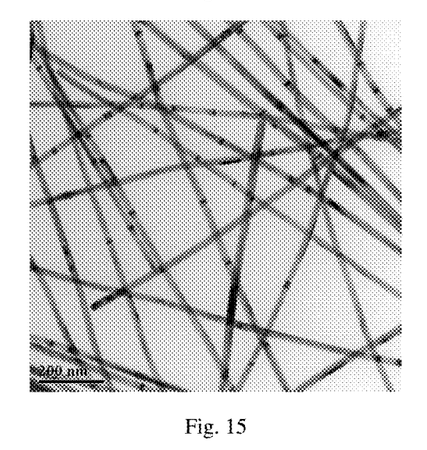
FIG. 15 is a microscopic view of the preferred silver nanowires of the metal nanowires A of the present invention.

The optical performance of the conductive layer is determined by the following factors: the diameter and aspect ratio of metal nanowires A, and the uniformity of metal nanowires A. FIG. 8 shows a microscopic view of the surface of the film with a very low distribution density of metal nanowires A. The distribution density of metal nanowires A in the conductive layer is low, leading the surface resistance of the conductive layer very high. The finer diameter and the larger aspect ratio of the metal nanowire A, the optical transmittance will be higher and the haze will be lower. In the actual preparation process, metal nanowires A are easily agglomerated or even merged in the conductive layer, resulting in lower optical transmittance and increased haze and chromaticity of the conductive layer. Silver is a good conductor of electricity, with low resistivity, high conductivity, and simple preparation process, the metal nanowires A are preferably a silver nanowires. FIG. 15 shows a scanning electron microscope photograph of silver nanowires, and the diameter of the silver nanowires is about 25 nm.

Protective layer: a dendrimer (Dendrimer) is a polyamidoamine dendrimer (PAMAM) or a carboxyl modified polyamidoamine dendrimer (PAMAM) i.e., PAMAM-COOH, or a hydroxyl modified polyamidoamine dendrimer (PAMAM) i.e., PAMAM-OH. The dendrimer PAMAM or modified PAMAM contains a large number of chelating groups that can trap metal ions in the conductive layer generated due to oxidation and form chelates, to prevent migration of metal ions. With the preferred silver nanowires as an example, migration of silver ions can be mechanistically viewed in three steps: electrolysis, ion migration and electrodeposition. The silver migration mechanism is explained as follows:

a) In a humid environment, water molecules are electrolyzed under an applied electric field:

$$H_2O \rightarrow H^+ + OH^- \tag{1}$$

b) Silver is dissociated to produce silver ions under the effect of an electric field and hydroxide ions:

$$Ag \rightarrow Ag^+ \tag{2}$$

c) Silver ions are migrated from high potential to low potential, encountered with OH⁻ at a boundary at which high potential connected with low potential:

$$Ag^+ + OH^- \rightarrow AgOH\downarrow \tag{3}$$

d) AgOH is unstable, to decompose into black Ag₂O precipitations:

$$2AgOH \rightarrow Ag_2O + H_2O \tag{4}$$

The dendrimer PAMAM or modified PAMAM in the protective layer contains amine groups inside. The provided lone pair electron nitrogen atoms can perform strong coordinated complexation with silver ions in empty orbital to form chelates and prevent migration of silver ions. The reaction equation being as follows:

$$nAg^+ + PAMAM \rightarrow nAg^+/PAMAM \tag{5}$$

The protective layer formulation solution contains monomers commonly used in the field: HEA, TPGDA, HPA, DAA, TMPTA, TMPTMA, EO-TMPTA, epoxy propylene ester, EO-CHA, DPGDA, IBOA, PGDA, PDDA, TEGDA, HDDA, BDDA and combinations thereof. The protective layer formulation solution contains initiators commonly used in the field, including: α-hydroxy ketone-based initiators (IRGACURE 184, DAROCUR 1173, IRGACURE 125, IRGACURE 500, IRGACURE 2595 of BASF, etc.), acylphosphine oxides (IRGACURE TPO, IRGACURE TPO-L of BASF, etc.) and ketone-based initiators, etc.

In other embodiments, the protective layer formulation solution contains prepolymers commonly used in the field: aliphatic urethane acrylate prepolymer, aromatic urethane acrylate prepolymer, urethane methacrylate, diallyl phthalate prepolymer, epoxy acrylate and epoxy methacrylate, etc.

The protective layer formulation includes other complexing agents, including: complexone (including aminotriacetic acid, namely, NTA, ethylenediaminetetraacetic acid, namely, EDTA, etc.), 8-hydroxyquinoline, dithizone, 2,2'-bipyridine (bipy), o-phenanthroline (C12H8N2), potassium sodium tartrate, ammonium citrate and inorganic complexing agent polyphosphate, etc.

The protective layer formulation contains stabilizers that can absorb ultraviolet light and prevent plasma resonance of metal crystals. The stabilizers including: benzophenone compounds, benzotriazole compounds, salicylate compounds, hindered amine compounds, substituted acrylonitrile compounds, etc.

The protective layer formulation contains antioxidants, including: thiodicarboxylic acid lipids, hydroxylamine compounds, bisphenol monoacrylate compounds, etc.

The protective layer may contain nanoparticles B, whose refractive index must be adapted to the metal nanowires A in the conductive layer. The nanoparticles B in the protective layer supplement the reduction in refractive index of the non-conductive area after etching, aiding in the formation of an optically consistent transparent conductive film. Nanoparticles B include metals, semiconductors, conductors, metal oxides or combinations thereof. The morphological structures are core-shell structures, heterojunction structures, alloys or combinations thereof. The vaporization temperature is higher than metal nanowires A, and the corrosion rate is less than metal nanowires A.

The UV-curing protective layer can enhance multiple properties of the conductive film. The light transmittance is increased more than 0.5%. The haze is reduced more than 0.2%. The oxidation of metal nanowires of the conductive layer and migration of metal ions are prevented. The surface resistance value is not changed. The electrical stability is increased by more than 5%. The anti-aging (light stability, thermal stability, humidity stability) time of the conductive layer is at least 240 h. The hardness of a conductive surface is greater than 1H after coating protective layer. The adhesion is greater than 5 B. The surface tension is greater than 28 mN/m.

The functional layer: as mentioned above, the substrate material enables the optically consistent transparent conductive film to have certain optical and mechanical properties. The functional layer is introduced to enhance specific properties of the transparent conductive film.

The transmission enhancement layer refers to a functional layer that increases the transmittance of transparent conductive film in the visible light area. Its operational mechanism is to redistribute transmitted light, reflected light and lights in other directions, to increase the proportion of transmitted light as much as possible. The transmission enhancement layer can be arranged between the substrate and the conductive layer, or on the back side of the substrate, or above the protective layer.

The anti-reflective layer refers to a functional layer that can reduce the reflection loss of visible light on the surface of transparent conductive film. The anti-reflective layer also has a function of transmission enhancement. So the anti-reflective layer can be arranged between the substrate and the conductive layer, or on the back side of the substrate, or above the protective layer. The anti-reflective layer materials are commonly used materials in the field, such as fluoropolymers[1, 2], perfluoropolymers[3], etc.

Figure 10:
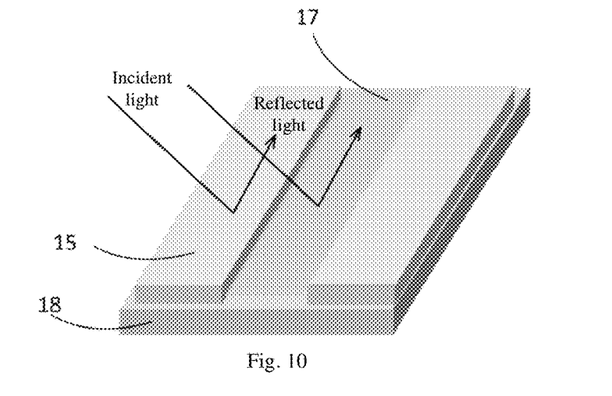
FIG. 10 is a schematic diagram of the influence of a substrate with an anti-glare layer on the reflectivity of light of the present invention.

The anti-glare layer is a functional layer that increases diffuse reflection and reduces harmful reflection by forming a certain concave and convex structure on the surface. The main functional components of the anti-glare layer include fluorine-based compounds, siloxane-based compounds[4], nanomaterials doped with oxides[5], transparent organic polymers[6], etc. In some embodiments, the anti-glare layer also contributes to optical extinction. For example, the film with an anti-glare layer with a haze of 12.5-15% is taken as a substrate in the embodiment of the present invention. The haze increases slightly after silver nanowires are coated, and the total haze is only 13.5-15%. After further etching treatment, the difference in haze between the etched area and the non-etched area is extremely small, achieving the objective of partial optical de-sharpening. As shown in FIG. 10, 17 refers to a non-conductive area in which nanoparticles B are uniformly distributed after the conductive layer of a substrate with an anti-glare layer is etched, and 18 refers to a substrate with an anti-glare layer.

Figure 3:
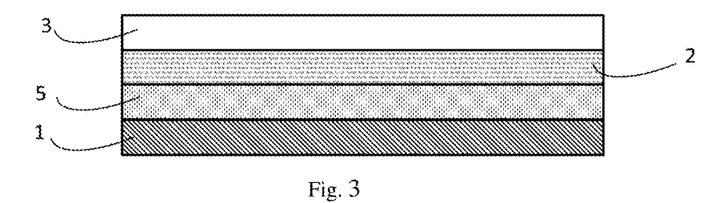
FIG. 3 is a structural schematic diagram of an optically consistent transparent conductive film with an optical adaptation layer of the present invention.
Figure 11:
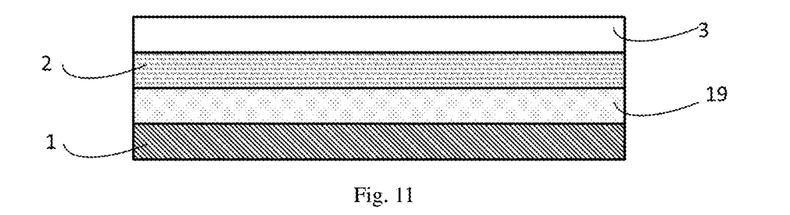
FIG. 11 is a structural schematic diagram showing that nanoparticles B singly serve as an optical adaptation layer of the present invention.

The optical adaptation layer refers to a metal layer or a ceramic layer formed through sputtering, evaporation or coating, such that refractive index compensation is formed between the substrate and the optically consistent conductive layer, thereby reducing the reflectivity difference between the conductive area and the non-conductive area after etching, and reducing the visual contrast. The optical adaptation layer materials contain metals, alloys, oxide nanomaterials and combinations thereof. The optical adaptation layer is usually arranged between the conductive layer and the substrate, and its structural diagram is as shown in FIG. 3. The nanoparticles B described in the present invention can also be used as an optical adaptation layer 5 alone, and its structure is shown in FIGS. 11, and 19 refers to an optical adaptation layer of nanoparticles.

The electrical adaptation layer is a dense planar conductive layer or an electrostatic layer with the main materials of conductive polymers (e.g. PEDOT:PSS), transparent conductive metal oxides, graphene, 2D conductive materials, carbon nanotubes and any combination thereof. The dense planar conductive layer is arranged above the protective layer, allowing the metal nanowires electrode to be converted from mesh full-plate conductive to dense full-plate conductive. The electrical adaptation layer is required in some product applications that require dense full-plate conductivity, such as PDLC, electrochromism, etc.

The hardened layer refers to an additional surface protective layer that prevents scratching or abrasion and can increase surface hardness. Hardened layer materials are crystalline materials, metal oxides, silicones, vinyltriethoxysilane (VTES), 3-mercaptopropyl triethoxysilane (MPTES), methacryloxy propyl trimethoxyl silane doped epoxy resins, and combinations thereof. The hardened layer is arranged on the back side of the substrate, or between the conductive surface and the substrate, or above the conductive layer or combinations thereof.

Technical solutions of the present invention include the following steps.

S1, Uniformly mixing 0.01-0.5% of metal nanoparticles B, 0.01%-5% of high-viscosity cellulose, 0.002-1% of leveling agent, 0.05-5% of metal nanowires A, and 70-99% of conductive ink solvent to form metal nanowire conductive ink;

S2, Coating the above conductive ink on a substrate, to form a conductive layer. Optionally, step S2 includes first optimization treatment, including: corona treatment or plasma treatment. The first optimization treatment is applicable to any stage of the step;

S3, Vaporizing or corroding the metal nanowires A through performing laser etching or wet etching on the conductive layer, while retaining the nanoparticles B at the etched position, to form a non-conductive area. Wherein due to the refractive index compensation effect and optical compensation effect of nanoparticles B, the non-conductive area and the conductive area constitute an optically consistent conductive layer; and S4, Coating protective solution containing dendrimers on the conductive layer or the optically consistent conductive layer, and performing thermal curing or ultraviolet curing to form a protective layer. Optionally, steps S3 and S4 include second optimization treatment including: infrared radiation treatment, microwave radiation treatment, xenon lamp pulse treatment and photon sintering treatment, and the second optimization treatment is applicable to any stage of the step.

Another embodiment provides a dense full-plate conductive film. S1, coating metal nanowire conductive ink on the substrate to form a conductive layer; optionally, step S1 includes first optimization treatment including: corona treatment and plasma treatment, and the first optimization treatment is applicable to any stage of the step; S2, coating a protective layer formulation solution containing dendrimers on the surface of a conductive layer, and performing thermal curing or ultraviolet curing to form a protective layer, step S2 includes second optimization treatment, including: infrared radiation treatment, microwave radiation treatment, xenon lamp pulse treatment, and photon sintering treatment, the second optimization treatment is applicable to any stage of the step; and S3, coating a dense planar conductive layer on the surface of the protective layer, to form a uniform composite transparent conductive film. The dielectric constant of the dense planar conductive layer is adapted to the metal nanowire conductive layer, and the dense planar conductive layer has strong resistance to corrosion, including acids, alkalis, chlorides, $H_2S$ gas, etc.

Another embodiment provides an optically consistent transparent conductive film with an optical adaptation layer. S1, forming a metal layer or a ceramic layer on a substrate through sputtering, evaporation and coating; S2, coating metal nanowire conductive ink on the substrate to form a conductive layer; optionally, step S2 includes first optimization treatment, including corona treatment and plasma treatment, and the first optimization treatment is applicable to any stage of the step; S3, vaporizing or corroding the metal nanowires A through performing laser etching or wet etching on the conductive layer, while retaining the nanoparticles B at the etched position, to form a non-conductive area, wherein due to the refractive index compensation effect and optical compensation effect of nanoparticles B, the non-conductive area and the conductive area constitute an optically consistent conductive layer; and S4, coating protective solution containing dendrimers on the conductive layer or the optically consistent conductive layer, and performing thermal curing or ultraviolet curing to form a protective layer. Optically, steps S3 and S4 include second optimization treatment, including infrared radiation treatment, microwave radiation treatment, xenon lamp pulse treatment and photon sintering treatment, and the second optimization treatment is applicable to any stage of the step. The optical adaptation layer enables the substrate and the optically consistent conductive layer to form refractive index compensation, to reduce the reflectivity difference between the conductive area and the non-conductive area after etching and reduce visual contrast.

Metal nanowire conductive ink: nanoparticles B include metals, semiconductors, conductors, metal oxides, or combinations thereof, and the morphological structures are core-shell structures, heterojunction structures, alloys, or combinations thereof. FIG. 4 is a structural schematic diagram of the morphology of nanoparticles B, wherein 6 refers to a spherical nanoparticle B, 7 refers to a core of a nanoparticle B with a core-shell structure, 8 refers to a shell of a nanoparticle B with a core-shell structure, 9 refers to a cubic nanoparticle B, 10 and 11 refer to two components of a heterojunction, respectively. Using infrared radiation treatment, microwave radiation treatment, xenon lamp pulse treatment, photon sintering treatment, etc., and selecting suitable intensity and treatment time, nanoparticles B are melted and grow secondarily to act as a medium to weld metal nanowires A. Nanoparticles B are uniformly distributed in a conductive area formed by the metal nanowires A superimposed or crosslinked with each other. Since the influence of the nanoparticles B on the electrical conductivity of the metal nanowires A is less than 50%, its own refractive index can offset the refractive index of metal nanowires A, thereby reducing the chromaticity of the optically consistent conductive layer. The vaporization temperature of nanoparticles B is higher than metal nanowires A, and the acid corrosion rate of metal nanowires A is 10 times greater than that of nanoparticles B. The optically consistent conductive layer coating is post-treated using different etching methods, nanoparticles B are uniformly distributed in the non-conductive area but do not form a continuous conductive path with each other. Nanoparticles B supplement the reflectivity of the non-conductive area, and the metal nanowires A and nanoparticles B in the conductive area produce similar reflectivity and reduce the etching marks of the optically consistent conductive film.

High-viscosity cellulose is taken as a film-forming agent, such as ethyl cellulose (EC), hydroxyethyl cellulose (HEC), methyl cellulose (MC), carboxymethyl cellulose (CMC), hydroxypropyl methyl cellulose (HPMC), hydroxypropyl cellulose (HPC), etc. Leveling agents include BYK Chemistry BYK-301, BYK-310, BYK-321, BYK-331, BYK-333, BYK-345, BYK-346, BYK-388, DOW CORNING DC-57, DOW CORNING DC-3, TEGO Glide 410, TEGO Glide 450, TEGO Flow 370, etc. Other additives can be added appropriately to adjust the film-forming properties of the ink. Other additives include defoamer, wetting agent, adhesion promoter, binder, etc. The diameter of the metal nanowires A is less than or equal to 200 nm and the aspect ratio is greater than or equal to 100, preferably silver nanowires. Conductive ink solvent includes one or more of water, ethanol and isopropanol.

The first optimization treatment method includes: corona treatment and plasma treatment, aiming at changing the surface tension of the coated substrate and improve the apparent properties of coating. The second optimization treatment includes infrared radiation treatment, microwave radiation treatment, xenon lamp pulse treatment, photon sintering treatment, etc., aiming at welding metal nanowires A through transient high energy.

Protective layer formulation solution: the protective layer is arranged on the surface of the conductive film of the optically consistent conductive layer. The protective layer contains a dendrimer with chelating effect, which can trap metal ions generated by metal nanowires A due to oxidation, thereby forming a chelate to inhibit migration of metal ions. The dendrimer is a polyamidoamine dendrimer (PAMAM) or a carboxyl modified polyamidoamine dendrimer (PAMAM), or a hydroxyl modified polyamidoamine dendrimer (PAMAM). The protective layer contains nanoparticles B. The refractive index of nanoparticles B is adapted to the refractive index of metal nanowires A in the conductive layer. The nanoparticles B in the protective layer supplement the refractive index of the non-conductive area after etching, to assist in forming an optically consistent transparent conductive film. Nanoparticles B include metals, semiconductors, conductors, metal oxides or combinations thereof, and their morphological structures are core-shell structures, heterojunction structures, alloys or combinations thereof, and the vaporization temperature is higher than that of metal nanowires A, and the corrosion rate is less than that of metal nanowires A.

The protective layer formulation solution contains monomers, functional additives and initiators commonly used in the field.

In other embodiments, the protective layer formulation solution contains prepolymers commonly used in the field.

The protective layer formulation solution contains other additives, including other complexing agents, ultraviolet absorbers, antioxidants, etc.

The present invention provides an optically consistent transparent conductive film. The conductive film innovatively adopts a dual nanomaterial system as a conductive layer. Through designing and adopting different physical and chemical properties of the nanomaterials, the conductive film may selectively retain a particular nanomaterial during subsequent circuitization, such that the conductive layer achieves adaptation of optical parameters such as refractive index, haze, and reflectivity.

The embodiment of the present invention is low in cost, simple in process and easy to implement. The optically consistent conductive film obtained by the invention has good photoelectric properties, can solve the problems of obvious post-treatment etching marks of metal nanowire conductive films, poor optical stability, easy corrosion of metal nanomaterials and migration of metal ions, and meets different application requirements. More importantly, the present invention initiatively proposes a conductive film structure of a dual nanomaterial system and orthogonal etching solution, which can be promoted and applied to the design of more photoelectric film structures in the field of printed electronics.

REFERENCES

[1] Vasilopoulou M, Douvas A M, Palilis L C, Bayiati P, Alexandropoulos D, Stathopoulos N A, et al., Highly transparent partially fluorinated methacrylate polymers for optical waveguides[J]. Microelectronic Engineering 2009, 86:1142-1145.

[2] Teng H, Liu W, Koike Y, Okamoto Y, Alternating copolymerization of bis(hexafluoroisopropyl) fumarate with styrene and vinyl pentafluorobenzoate: Transparent and low refractive index polymers[J]. Journal of Polymer Science Part A: Polymer Chemistry 2011, 49:2834-2838.

[3] Fluorinated Surfaces, Coatings, and Films, Copyright, Foreword[J]. 2001, 787:i-iii.

[4] Hiromasa Minamino, Takashi Fukunishi, Kenkei Kojima, Koichi Ueda. Anti-glare Coating Compositions, Anti-glare Films, and Manufacturing Methods Thereof [P]. CN101246224A.

[5] Dou Fan, Zhu Hongwei, Che Hongwei, Dou Jinhao. Nano Coating Material and Preparation Method Thereof [P]. CN1 298906A.

[6] Akiaki Watarai, Kihiro Yamahara. Anti-glare Film and Manufacturing Method Thereof, Polarizing Component and Display Device Using Polarizing Component, and Internal Diffusion Film [P]. CN 1414401A.

BRIEF DESCRIPTION OF THE DRAWINGS

The same reference numerals in the accompanying drawings represent identical or similar components. To facilitate understanding, most of the components in the accompanying drawings are infinitely enlarged, and specific shapes in the accompanying drawings are unrelated to the shape information of the actual components, and are merely for ease of identification and illustration. Obviously, other accompanying drawings may be obtained by those skilled in the art based on these accompanying drawings without any creative effort.

REFERENCE NUMERALS

1 refers to a substrate, 2 refers to a metal nanowire conductive layer, 3 refers to a protective layer, 4 refers to an electric adaptation layer, 5 refers to an optical adaptation layer, 6 refers to a spherical nanoparticle B, 7 refers to a core of a nanoparticle B with a core-shell structure, 8 refers to a shell of a nanoparticle B with a core-shell structure, 9 refers to a cubic nanoparticle B, 10 and 11 are respectively two components of a heterojunction, 12 refers to a metal nanowire A, 13 refers to a nanoparticle B, 14 refers to a non-conductive area in which etched nanoparticles B are uniformly distributed, 15 refers to conductive area after the conductive layer of conductive film is etched, 16 refers to a non-conductive area in which nanoparticles B are uniformly distributed after the conductive layer of conductive film containing an optical adaptation layer is etched, 17 refers to a non-conductive area in which nanoparticles B are uniformly distributed after the conductive layer of a substrate with an anti-glare layer is etched, 18 refers to a substrate with an anti-glare layer, 19 refers to an optical adaptation layer of nanoparticles, 20 refers to a conductive area after etching of the conductive layer, 21 refers to laminating adhesive, 22 refers to a non-conductive area with nanoparticles B being uniformly distributed, 23 refers to a non-conductive area with no residue, 24 refers to a non-conductive area filled with laminating adhesive, 25 refers to a non-etched area in the Y direction, 26 refers to a conductive connecting layer in the X direction, 27 refers to a conductive area in the Y direction, 28 refers to a conductive area in the X direction, 29 refers to a non-conductive area, and 30 refers to an insulating layer.

DETAILED DESCRIPTION OF THE EMBODIMENTS

The embodiments of the present invention are set forth below, and it should be clear to those skilled in the art that the embodiments set forth are merely a portion of the embodiments of the present invention and should not be considered as a specific limitation to the present invention.

Embodiment 1

Figure 1:
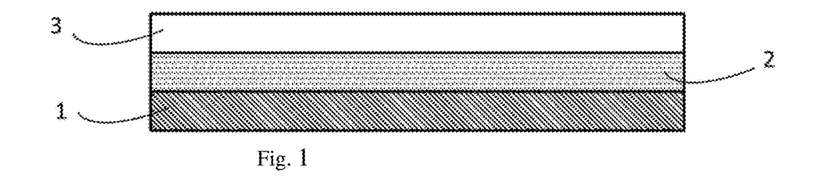
FIG. 1 is a structural schematic diagram of a full-plate conductive optically consistent transparent conductive film of the present invention.

S1, uniformly mixing 0.01% of nanoparticles B, 0.2% of high-viscosity cellulose HPMC as a film-forming agent, 0.01% of leveling agent DOW CORNING DC-57, 1% of metal nanowires A and 98.78% of solvent (including water, ethanol and isopropanol) to form conductive ink; S2, coating conductive ink on the substrate using a slot die coating method to form a conductive layer; S3, uniformly mixing 0.02% of polyamidoamine dendrimer (PAMAM), 0.5% of trimethylolpropane trimethacrylate (TMPTMA), 0.2% of 1,6-hexanediol diacrylate (HDDA), 0.1% of phenoxyl ethyl acrylate (PHEA), 0.15% of ultraviolet absorber BASF Tinuvin 234, 0.09% of cellulose acetate butyrate (CAB), 0.08% of antioxidant Irganox 1098, 8% of diacetone alcohol, 83.51% of isopropanol, 7% of ethanol, 0.3% of photoinitiator DAROCUR 1173 and 0.05% of IRGACURE2595, to form a protective layer formulation solution; and S4, coating protective solution on the surface of the conductive layer, and performing thermal curing or ultraviolet curing to form a protective layer. The finally formed optically consistent transparent conductive film is as shown in FIG. 1 and FIG. 13. As shown in FIG. 1, the structure of the optically consistent transparent conductive film includes a substrate 1, a metal nanowire conductive layer 2 and a protective layer 3. Optionally, the substrate may contain one or more layers of a transmission enhancement layer, an anti-reflective layer, an anti-glare layer, and a hardened layer, and may not contain a functional layer. FIG. 13 shows a microscopic view of the surface of an optically consistent transparent conductive film, with metal nanowires A and nanoparticles B uniformly distributed in the conductive layer.

Embodiment 2

S1, uniformly mixing 0.01% of nanoparticles B, 0.2% of high-viscosity cellulose CMC as a film-forming agent, 0.01% of leveling agent DOW CORNING DC-57, 1.5% of metal nanowires A and 98.28% of solvent (including water, ethanol and isopropanol) to form conductive ink; S2, coating conductive ink on the substrate using a slot die coating method to form a conductive layer; S3, uniformly mixing 0.01% of dendrimer hydroxyl modified polyamidoamine dendrimer (PAMAM-OH), 0.01% of complexone being ethylenediaminetetraacetic acid (EDTA), 0.8% of trimethylolpropane triacrylate (TMPTA), 0.2% of 1,6-hexanediol diacrylate (HDDA), 0.1% of phenoxyl ethyl acrylate (PHEA), 0.15% of ultraviolet absorber BASF Tinuvin 234, 0.3% of cellulose acetate butyrate (CAB), 0.08% of the antioxidant Irganox 1010, 8% of diacetone alcohol, 83% of isopropanol, 7% of ethanol, 0.3% of the initiator DAROCUR 1173 and 0.05% of IRGACURE 2595, to form a protective layer formulation solution; and S4, coating protective solution on the surface of the conductive layer, and performing thermal curing or ultraviolet curing to form a protective layer. The finally formed optically consistent transparent conductive film is as shown in FIG. 1 and FIG. 13.

Embodiment 3

Figure 5:
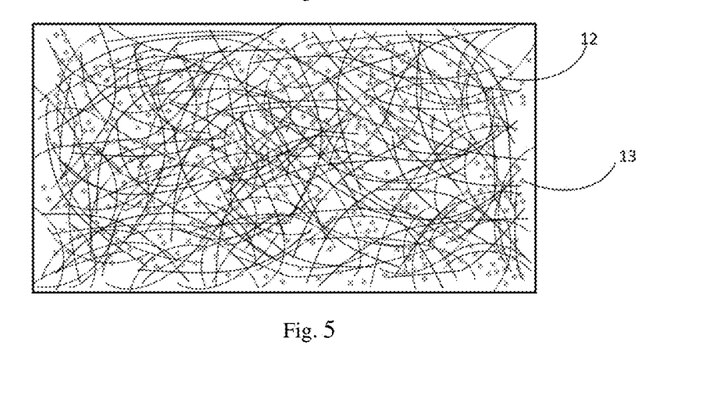
FIG. 5 is a structural schematic diagram of the surface of the full-plate conductive optically consistent transparent conductive film of the present invention without welding metal nanowires A by nanoparticles B.
Figure 6:
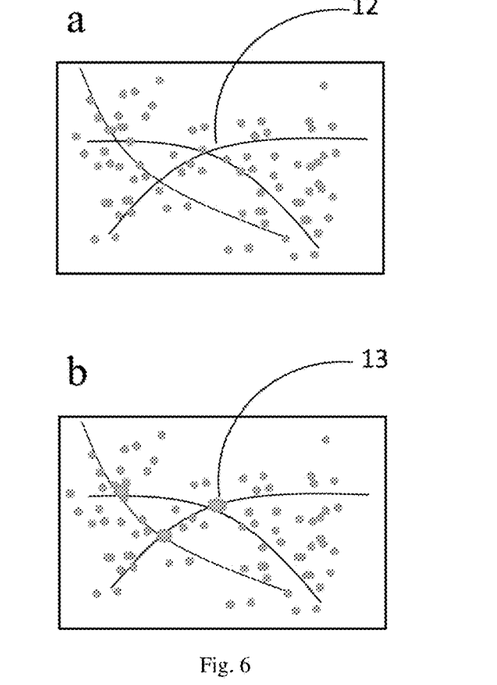
FIG. 6a and FIG. 6b are structural schematic diagrams of the surface of the optically consistent transparent conductive film before and after welding metal nanowires A by nanoparticles B in the present invention.

S1, uniformly mixing 0.5% of nanoparticles B, 0.8% of high-viscosity cellulose HPMC as a film-forming agent, 0.1% of leveling agent TEGO Glide 410, 1% of metal nanowires A and 97.6% of solvent (including water, ethanol and isopropanol), to form conductive ink; S2, coating conductive ink on the substrate using a slot die coating method to form a conductive layer, as shown in FIG. 5, the metal nanowires A12 and nanoparticles B13 are uniformly distributed on the surface of the substrate, to form a full-plate conductive network; S3, performing infrared radiation treatment, microwave radiation treatment, xenon lamp pulse treatment, or photon sintering treatment on the conductive layer, and by adjusting the parameters of the post-treatment, such as frequency, energy, and treatment time, melting some of the nanoparticles B in the conductive layer and making them grow secondarily to act as a medium to weld the metal nanowires A, as shown in FIG. 6a and FIG. 6b, wherein as shown in FIG. 6a, before nanoparticles B are welded, the metal nanowires A and nanoparticles B are uniformly distributed on the conducive layer; as shown in FIG. 6b, under certain conditions, nanoparticles B weld nearby or directly overlapped metal nanowires A through melting and secondary growth; S4, uniformly mixing 0.005% of polyamidoamine dendrimer (PAMAM), 1% of ethoxylated trimethylolpropane triacrylate (EO-TMPTA), 0.5% of isobornyl acrylate (IBOA), 0.2% of phenoxyethyl acrylate (PHEA), 0.12% of ultraviolet absorber BASF Tinuvin 144, 0.09% of cellulose acetate butyrate (CAB), 0.1% of antioxidant SONGNOX 4150, 8% of diacetone alcohol, 82.585% of isopropanol, 7% of ethanol, 0.4% of initiator IRGACURE 184, to form a protective layer formulation solution; and S5, coating protective solution on the surface of the conductive layer, and performing thermal curing or ultraviolet curing to form a protective layer, to finally form the optically consistent transparent conductive film.

Embodiment 4

S1, uniformly mixing 0.5% of nanoparticles B, 0.8% of high-viscosity cellulose HPMC as a film-forming agent, 0.1% of leveling agent BYK-345, 1% of metal nanowires A and 97.6% of solvent (including water, ethanol and isopropanol) to form conductive ink; S2, coating conductive ink on the substrate using a slot die coating method to form a conductive layer; S3, performing laser etching on the conductive layer, vaporizing or corroding the metal nanowires A, while retaining the nanoparticles B at the etched position, to form a non-conductive area; S4, uniformly mixing 0.04% of dendrimer hydroxyl modified polyamidoamine (PAMAM-OH), 0.5% of trimethylolpropane trimethacrylate (TMPTMA), 0.2% of isobornyl acrylate (IBOA), 0.1% of phthalic acid diethylene glycol diacrylate (PDDA), 0.005% of ultraviolet absorbent Tinuvin 123, 0.5% of cellulose acetate butyrate (CAB), 0.005% of antioxidant Irganox 1076, 10% of diacetone alcohol, 83.35% of isopropanol, 5% of ethanol, 0.3% of initiator IRGACURE 2595, to form a protective layer formulation solution; and S5, coating protective solution on the surface of the conductive layer, and performing thermal curing or ultraviolet curing to form a protective layer, to finally form an optically consistent transparent conductive film. As shown in FIG. 7 and FIG. 14, 14 refers to a non-conductive area in which etched nanoparticles B are uniformly distributed, 15 refers to an etched conductive area, after etching, metal nanowires A and nanoparticles B are uniformly distributed in a non-etched area, that is, a conductive area, nanoparticles B are uniformly distributed in an etched area, that is, a non-conductive area, and nanoparticles B do not form a conductive pathway, and the conductive area and the non-conductive area form an optically consistent transparent conductive film.

Embodiment 5

Figure 9:
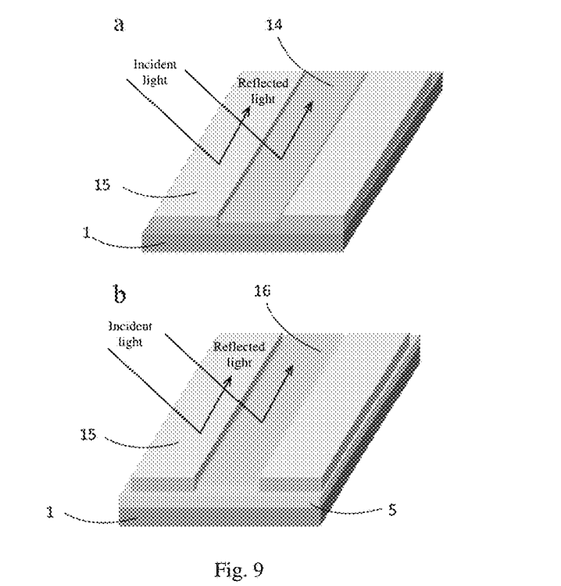
FIG. 9a and FIG. 9b are schematic diagrams of the influence of a sputtering optical adaptation layer on the reflectivity of light of the present invention.

S1, uniformly mixing 0.5% of nanoparticles B, 0.8% of high-viscosity cellulose HPC as a film-forming agent, 0.05% of leveling agent BYK-345, 0.5% of metal nanowires A and 98.15% of solvent (including water, ethanol and isopropanol) to form conductive ink; S2, sputtering a metal layer or a ceramic layer on the substrate to form an optical adaptation layer; S3, coating conductive ink on the substrate using a slot die coating method to form a conductive layer; S4, performing infrared radiation treatment, microwave radiation treatment, xenon lamp pulse treatment, and photon sintering treatment on the conductive layer, and by adjusting the parameters of the post-treatment, such as frequency, energy, and treatment time, melting some of the nanoparticles B in the conductive layer and making them grow secondarily to act as a medium to weld the metal nanowires A; S5, performing laser etching on the conductive layer, vaporizing or corroding the metal nanowires A, while retaining the nanoparticles B at the etched position, to form a non-conductive area; S6, uniformly mixing 0.008% of polyamidoamine dendrimer (PAMAM), 1% of trimethylolpropane trimethacrylate (TMPTMA), 0.8% of 1,6-hexanediol diacrylate (HDDA), 0.3% of isobornyl acrylate (IBOA), 0.3% of ultraviolet absorber BASF Tinuvin 765, 2% of cellulose acetate butyrate (CAB), 0.3% of antioxidant Irganox 168, 8% of diacetone alcohol, 80.192% of isopropanol, 7% of ethanol, 0.1% of initiator DAROCUR 1173, to form a protective layer formulation solution; and S7, coating protective solution on the surface of the conductive layer, and performing thermal curing or ultraviolet curing to form a protective layer, to finally form an optically consistent transparent conductive film. FIG. 9a and FIG. 9b are schematic diagrams showing influence of a sputtering optical adaptation layer on the reflectivity of light, 16 refers to a non-conductive area in which nanoparticles B are uniformly distributed after the conductive layer of conductive film containing an optical adaptation layer is etched, the optical adaptation layer enables the substrate and the optically consistent conductive layer to form refractive index compensation, thereby reducing the reflectivity difference of the conductive area and the non-conductive area after etching, and reducing visual contrast.

Embodiment 6

S1, uniformly mixing 0.5% of nanoparticles B, 5% of high-viscosity cellulose HPMC as a film-forming agent, 1% of leveling agent BYK-301, 0.5% of metal nanowires A and 93% of solvent (including water, ethanol and isopropanol) to form conductive ink; S2, coating conductive ink on the substrate using a slot die coating method to form a conductive layer; S3, uniformly mixing 0.02% of polyamidoamine dendrimer (PAMAM), 0.6% of trimethylolpropane triacrylate (TMPTA), 0.1% of 1,6-hexanediol diacrylate (HDDA), 0.2% of ultraviolet absorber BASF Tinuvin 765, 0.15% of cellulose acetate butyrate (CAB), 0.1% of antioxidant Irganox 1098, 8% of diacetone alcohol, 83.33% of isopropanol, 7% of ethanol, and 0.5% of initiator IRGACURE 184, to form a protective layer formulation solution; S4, coating protective solution on the surface of the conductive layer, and performing thermal curing or ultraviolet curing to form a protective layer; and S5, coating a dense planar conductive layer on the surface of the protective layer, to form a dense full-plate conductive composite transparent conductive film.

Figure 2:
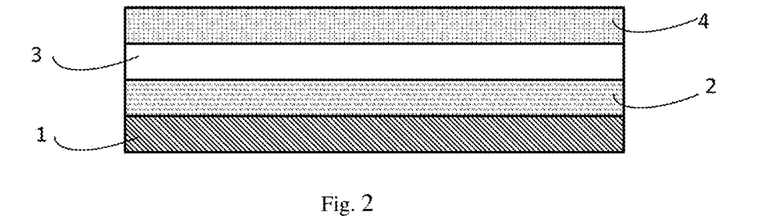
FIG. 2 is a structural schematic diagram of a dense full-plate conductive composite transparent conductive film with a dense planar conductive layer of the present invention.

FIG. 2 is a structural schematic diagram of a dense full-plate conductive composite transparent conductive film with a dense planar conductive layer being arranged above a protective layer. 4 refers to an electrical adaptation layer. The dielectric constant of the dense planar conductive layer can be adapted to the dielectric constant of the metal nanowire conductive layer, and the dense planar conductive layer has strong corrosion resistance, including acids, alkalis, chlorides, $H_2S$ gas, etc., and can be used in electromagnetic shielding, smart windows, smart handwriting boards, etc.

Embodiment 7

S1, uniformly mixing 0.5% of nanoparticles B, 5% of high-viscosity cellulose HPMC as a film-forming agent, 1% of leveling agent BYK-301, 0.5% of metal nanowires A and 93% of solvent (including water, ethanol and isopropanol), to form conductive ink; S2, coating conductive ink on the substrate using a slot die coating method to form a conductive layer; S3, performing infrared radiation treatment, microwave radiation treatment, xenon lamp pulse treatment, and photon sintering treatment on the conductive layer, and by adjusting the parameters of the post-treatment, such as frequency, energy, and treatment time, melting some of the nanoparticles B in the conductive layer and making them grow secondarily to act as a medium to weld the metal nanowires A; S4, uniformly mixing 0.04% of dendrimer hydroxyl modified polyamidoamine (PAMAM-OH), 1% of tripropylene glycol diacrylate (TPGDA), 0.5% of trimethylolpropane trimethacrylate (TMPTMA), 0.3% of phenoxyethyl acrylate (PHEA), 0.5% of ultraviolet absorber BASF Tinuvin 791FB, 0.1% of cellulose acetate butyrate (CAB), 0.1% of antioxidant Irganox 1076, 8% of diacetone alcohol, 84.17% of isopropanol, 5% of ethanol, 0.2% of initiator IRGACURE 184 and 0.09% of IRGACURE 2595, to form a protective layer formulation solution; S5, coating protective solution on the surface of the conductive layer, and performing thermal curing or ultraviolet curing to form a protective layer; and S6, coating a dense planar conductive layer on the surface of the protective layer, to form a dense full-plate conductive composite transparent conductive film, as shown in FIG. 2 which is a structural schematic diagram of a dense full-plate conductive composite transparent conductive film with a dense planar conductive layer being arranged above the protective layer.

The present invention can also have other embodiments, the dendrimer in the protective layer can be carboxyl modified PAMAM or hydroxyl modified PAMAM, while other complexing agents can be added, prepolymers can be added, and the type and adding amount of monomers, antioxidants and ultraviolet absorbers can be changed; and the coating process can be optimized by corona treatment, plasma treatment, etc.

As to the optically consistent transparent conductive film and a design method thereof provided in the present invention, the method is simple and feasible, the conditions are mild. The present invention can solve the problems of obvious post-treatment etching marks of metal nanowire conductive films, easy corrosion of metal materials and migration of metal ions. The conductive film is favorable in uniformity, excellent in stability, and can satisfy different application requirements.

Finally, it should be noted that the above embodiments are merely used to illustrate rather than limiting the technical solution of the present invention. Although the present invention is described in details with reference to the embodiments, those skilled in the art should understand that any modification or equivalent substitution made to the technical solution of the present invention does not depart from the spirit and scope of the technical solution of the present invention, and should fall within the scope of the claims of the present invention.

The invention claimed is:

1. An optically consistent transparent conductive film, wherein the optically consistent transparent conductive film comprises a substrate, an optically consistent conductive layer and a protective layer;
wherein the substrate comprises a rigid or/and flexible substrate;
the optically consistent conductive layer comprises a conductive area, the conductive area comprises metal nanowires A and nanoparticles B, the metal nanowires A superimpose or crosslink to form a network in a conductive area, the nanoparticles B function to weld the metal nanowires A; the nanoparticles B are uniformly distributed in the conductive area, the influence of the nanoparticles B on the conductivity of the metal nanowires A is less than 50%; the optically consistent conductive layer comprises a non-conductive area obtained by etching the metal nanowires A in the conductive area, the non-conductive area comprises uniformly distributed nanoparticles B, the nanoparticles B do not form a continuous conductive pathway with each other in the non-conductive area; the vaporization temperature of the nanoparticles B is higher than that of the metal nanowires A; the corrosion rate of the metal nanowires A is faster than nanoparticles B; and the refractive index of the nanoparticles B is adapted to that of the metal nanowires A; and
the protective layer is coated on the surface of the optically consistent conductive layer, and the surface resistance value is not changed; the protective layer contains dendrimers having a chelating effect, the dendrimer has an effect of trapping metal ions to form a chelate to inhibit migration of metal ions; the protective layer further comprises dispersed nanoparticles B, and the nanoparticles B have the effect of reducing the chromaticity of the conductive area.

2. The optically consistent transparent conductive film of claim 1, wherein the rigid substrate comprises one of glass, PMMA organic glass, PC polycarbonate or acrylic resin; and the flexible substrate comprises one of polyester, polyethylene, cycloolefin polymer, colorless polyimide, polypropylene, or polyethylene.

3. The optically consistent transparent conductive film of claim 1, wherein the protective layer comprises dendrimers with a chelating effect, the dendrimer comprises one or more of a polyamidoamine dendrimer, a carboxyl modified polyamidoamine dendrimer and a hydroxyl modified polyamidoamine dendrimer.

4. The optically consistent transparent conductive film of claim 1, wherein the optically consistent transparent conductive film further comprises functional layers, and the functional layers comprise one or any combination of a transmission enhancement layer, an anti-reflective layer, an anti-glare layer, an optical adaptation layer, an electrical adaptation layer, and a hardened layer.

5. The optically consistent transparent conductive film of claim 4, wherein the transmission enhancement layer comprises a fluoropolymer, and the transmission enhancement layer is arranged between the substrate and the conductive layer, or on the back side of the substrate, or above the protective layer;
the anti-reflective layer comprises a fluoropolymer or a perfluoropolymer, and the anti-reflective layer is arranged between the substrate and the conductive layer, or on the back side of the substrate, or above the protective layer;
the composition of the anti-glare layer comprises one or more of a fluorine-based compound, a siloxane-based compound, nanomaterials doped with oxides or a transparent organic polymer, and the anti-glare layer is arranged on the back side of the substrate;
the optical adaptation layer is a metal layer or a ceramic layer formed by sputtering, evaporation or coating, the optical adaptation layer comprises metals, alloys, oxide nanomaterials and combinations thereof, and the optical adaptation layer is arranged between the conductive layer and the substrate; and the electrical adaptation layer is a dense planar conductive layer or an electrostatic layer, wherein the dense planar conductive layer or the electrostatic layer comprises one or more of PEDOT:PSS, transparent conductive metal oxides, graphene, carbon nanotubes and carbon black, and the electrical adaptation layer is arranged above or below the protective layer.

6. The optically consistent transparent conductive film of claim 1, wherein the morphology of nanoparticles B comprises a spherical shape, a core-shell, a rod, a heterojunction, or any combination thereof; the material of the nanoparticles B comprises metals, alloys, oxides, semiconductors, conductors, insulators or any combination thereof; the size of the nanoparticles B is less than or equal to 200 nm, the structure of the metal nanowire A comprises one or more of core-shell nanowire, hollow nanowire and solid nanowire; and the metal nanowire A has a diameter of 5-200 nm and an aspect ratio of more than or equal to 100.

7. A preparation method of the optically consistent transparent conductive film of claim 1, comprising the following steps or a combination thereof:
S1, coating conductive ink on the substrate to form a conductive area, wherein the conductive ink includes nanoparticles B and metal nanowires A;
S2, etching the metal nanowires A at the conductive area prepared in S1 to form a non-conductive area, vaporizing or corroding the metal nanowires A, while retaining the nanoparticles B at the etched position; and
S3, constituting an optically consistent conductive layer by the conductive area formed in S1 and the non-conductive area formed in S2, coating protective layer formulation solution containing dendrimer on the conductive layer, and performing thermal curing or ultraviolet curing to form a protective layer.

8. The preparation method of claim 7, wherein the conductive ink formulation comprises 0.01-0.5% of metal nanoparticles B, 0.01%-5% of film-forming agent, 0.002-1% of leveling agent, and 0.05-5% of metal nanowires A, and comprises 70-99% of conductive ink solvent.

9. The preparation method of claim 7, wherein the protective layer formulation solution comprises 0.001%-0.05% of dendrimers, 0.07%-8% of monomers, 0.05%-1.5% of initiators, and 0.1%-5% of prepolymers, wherein the monomer comprises one or more of HEA, TPGDA, HPA, DAA, TMPTA, TMPTMA, EO-TMPTA, epoxy propylene ester, EO-CHA, DPGDA, IBOA, PGDA, PDDA, TEGDA, HDDA and BDDA; the initiator comprises one or more of α-hydroxyketone-based initiators, acylphosphine oxides and ketone-based initiators; the prepolymer comprises one or more of aliphatic polyurethane acrylate prepolymer, aromatic polyurethane acrylate prepolymer, polyurethane methacrylate, diallyl phthalate prepolymer, epoxy acrylate and epoxy methacrylate.

10. The preparation method of claim 9, wherein the protective layer formulation solution also contains one or more of 0.003%-0.3% of complexing agent, 0.005%-0.4% of stabilizer and 0.003%-0.5% of antioxidant;
wherein the complexing agent complexes metal ions, the complexing agent comprises one or more of complexone, 8-hydroxyquinoline, dithizone, 2,2'-bipyridine (bipy), o-phenanthroline ($C_{12}H_8N_2$), potassium sodium tartrate, ammonium citrate and inorganic complexing agent polyphosphate; the stabilizing agent comprises one or more of BASF ultraviolet absorber C81, Chimassorb 944, Tinuvin 770DF, Tinuvin 900, Tinuvin 123, Tinuvin 326, Tinuvin 234, Tinuvin 765, Tinuvin 791FB, Tinuvin 384-2, Tinuvin 144, UV70 and UV90; and the antioxidant comprises one or more of SONGNOX 4150, Irganox 1098, Irganox 1076, Irganox 1010 and Irganox 168.

11. The preparation method of claim 7, wherein step S1 further comprises first optimization treatment, the first optimization treatment is applicable to any stage of the step, the first optimization treatment comprises: corona treatment and plasma treatment; step S2 further comprises second optimization treatment, the second optimization treatment is applicable to any stage of the step; step S3 comprises second optimization treatment, the second optimization treatment is applicable to all stages of the step; and the second optimization treatment comprises: infrared radiation treatment, microwave radiation treatment, xenon lamp pulse treatment and photon sintering treatment.

12. A product that includes therein the optically consistent transparent conductive film of claim 1, wherein the product is selected from the group consisting of rigid or flexible touch screens, rigid or flexible displays, cell phone antenna circuits, infrared optical imaging elements, photoelectric sensors, electromagnetic shielding, smart windows, smart handwriting boards and solar cells.

* * * * *